United States Patent
Kim

(10) Patent No.: US 6,548,349 B2
(45) Date of Patent: Apr. 15, 2003

(54) METHOD FOR FABRICATING A CYLINDER-TYPE CAPACITOR FOR A SEMICONDUCTOR DEVICE

(75) Inventor: Hong-ki Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 22 days.

(21) Appl. No.: 09/886,066

(22) Filed: Jun. 21, 2001

(65) Prior Publication Data

US 2002/0090778 A1 Jul. 11, 2002

(30) Foreign Application Priority Data

Jan. 10, 2001 (KR) .......................................... 2001-1353

(51) Int. Cl.$^7$ .......................................... H01L 21/8242
(52) U.S. Cl. ....................... 438/253; 438/254; 438/255; 438/396; 438/398
(58) Field of Search ................................ 438/239, 240, 438/241, 250, 251, 253, 254, 255, 256, 396, 393, 394, 397, 398, 399, 243, 244, 386, 387; 257/296, 303, 306, 309, 310, 301

(56) References Cited

U.S. PATENT DOCUMENTS 6,037,234 A * 3/2000 Hong et al. ................. 438/396
6,184,078 B1 * 2/2001 Yoon et al. ................. 438/253
6,190,962 B1 * 2/2001 Chen et al. ................. 438/253

FOREIGN PATENT DOCUMENTS

JP    2002-222872   * 8/2002
KR   P1997-0011759    7/1997 ............ H01L/27/10
KR   P1999-004603     1/1999 ......... H01L/27/108

* cited by examiner

*Primary Examiner*—Carl Whitehead, Jr.
*Assistant Examiner*—Jack Chen
(74) *Attorney, Agent, or Firm*—Mills & Onello, LLP

(57) ABSTRACT

A method for fabricating a cylinder-type capacitor for a semiconductor device includes the steps of forming in sequence a first insulating layer, a first etch stop layer, a second insulating layer, and a second etch stop layer on a semiconductor substrate including a conductive region, forming a second etch stop layer pattern, a second insulating layer pattern, and a first etch stop layer pattern by etching a part of the second etch stop layer, the second insulating layer, and the first etch stop layer so that a storage node hole for exposing the surface of a part of the first insulating layer may be formed, forming a spacer on an inner wall of the storage node hole, forming a first insulating layer pattern by etching the first insulating layer exposed using the second etch stop layer pattern and the spacer as a mask so that a node contact hole for exposing the conductive region is formed, removing the second etch stop layer pattern and the spacer, forming a lower electrode on the surfaces of the storage node hole and the node contact hole, and forming a dielectric layer and an upper electrode on the lower electrode. According to the present invention, a semiconductor cylinder-type capacitor is provided at a relatively low production cost using simplified fabrication processes.

33 Claims, 14 Drawing Sheets

METHOD FOR FABRICATING A CYLINDER-TYPE CAPACITOR FOR A SEMICONDUCTOR DEVICE

BACKGROUND OF THE INVENTION

1. Field of the Invention

The present invention relates to a method for fabricating a capacitor for a semiconductor device, and more particularly, to a method for fabricating a cylinder-type capacitor for a semiconductor device.

2. Description of the Related Art

The performance characteristics of a memory cell such as a dynamic random access memory (DRAM) among semiconductor devices share an direct connection with the capacitance of the memory cell capacitor. For example, as the capacitance of the cell capacitor increases, the low voltage characteristics and soft error characteristics of the memory cell are improved.

As semiconductor devices continue to become more highly-integrated, the available area of a unit cell in which a capacitor is formed decreases. Thus, methods for increasing the capacitance of a capacitor within the limited area are necessary.

A number of techniques have been suggested for accomplishing capacitor integration. These include forming the capacitor dielectric layer into a thin film, using a material having a high dielectric constant as the dielectric layer, and increasing the effective area of a capacitor electrode by making a cylinder-type electrode or a fin-type electrode or by growing hemispherical grains (HSGs) on the surface of the electrode.

Hereinafter, referring to FIGS. 1 through 5, a conventional method for fabricating a cylinder-type capacitor for a semiconductor device will be described. Like reference numerals refer to like elements throughout the drawings.

Referring to FIG. 1, a first insulating layer 120 is formed on a semiconductor substrate 100 on which a conductive region 110 is formed. A first photoresist pattern 122 having a first opening A at the position corresponding to the conductive region 110 is formed on the first insulating layer 120.

Referring to FIG. 2, the exposed portion of the first insulating layer 120 is etched, using the first photoresist pattern 122 as a mask, and thereby forming a first insulating layer pattern 120a having a contact hole 125 for exposing the conductive region 110. After the first photoresist pattern 122 is removed, a first conductive layer 130 for filling the contact hole 125 is formed.

Referring to FIG. 3, the upper surface of a resultant structure shown in FIG. 2 is planarized to expose the upper surface of the first insulating layer pattern 120a, and thereby forming a contact plug 130a. A etch stop layer 140 and a second insulating layer 150 are formed in sequence on the surface of the top of the first insulating layer pattern 120a and the contact plug 130a. A second photoresist pattern 152 having a second opening B at a position above the contact plug 130a is formed on the second insulating layer 150.

Referring to FIG. 4, the second insulating layer 150 and the etch stop layer 140 are etched by using the second photoresist pattern 152 as a mask, and thereby forming a second insulating layer pattern 150a and an etch stop layer pattern 140a having a storage node hole 155 for exposing the surface of the top of the contact plug 130a. After the second photoresist pattern 152 is removed, a second conductive layer 160 is formed at a thickness such that the storage node hole 155 is not completely filled.

Referring to FIG. 5, the top of the second conductive layer 160 and the second insulating layer pattern 150a are removed to form a separated storage node 160a. A dielectric layer 180 and an upper electrode 190 are formed on the storage node 160a.

According to the conventional method described above, in order to form a contact plug and a storage node, the photolithography process is performed twice, as described with reference to FIGS. 1 and 3. As described with reference to FIGS. 2 and 4, the process for forming a conductive layer is performed twice. The photolithography process is limited in that it requires the use of expensive exposure equipment having high resolution capabilities, and is a process that influences productivity due to high production cost. Also, since the polysilicon layer is formed by diffusion in the process for forming the conductive layer, the process takes a relatively long time to complete.

Thus, in the above conventional method for fabricating a cylinder-type capacitor of a semiconductor device, the number of processes is large, and the production cost is high.

SUMMARY OF THE INVENTION

To address the above limitations, it is an object of the present invention to provide a method for fabricating a cylinder-type capacitor for a semiconductor device, while reducing production cost and simplifying the process.

Accordingly, to achieve the above object, there is provided a method for fabricating a cylinder-type capacitor for a semiconductor device. The method includes the steps of forming in sequence a first insulating layer, a first etch stop layer, a second insulating layer, and a second etch stop layer on a semiconductor substrate including a conductive region, forming a second etch stop layer pattern, a second insulating layer pattern, and a first etch stop layer pattern by etching a part of the second etch stop layer, the second insulating layer, and the first etch stop layer so that a storage node hole for exposing the surface of a part of the first insulating layer may be formed, forming a spacer on an inner wall of the storage node hole, forming a first insulating layer pattern by etching the first insulating layer exposed using the second etch stop layer pattern and the spacer as a mask so that a node contact hole for exposing the conductive region may be formed, removing the second etch stop layer pattern and the spacer, forming a lower electrode on exposed surfaces of the storage node hole and the node contact hole, and forming a dielectric layer and an upper electrode on the lower electrode.

The conductive region may be an active region on the surface of the semiconductor substrate, or a contact pad on the top of the semiconductor substrate.

The method further includes the step of forming a contact pad self-aligned by two neighboring gate electrodes formed on the semiconductor substrate, and the conductive region may be the contact pad. Here, the step of forming a contact pad includes the steps of forming an interdielectric layer which fills a space between the two gate electrodes, forming a contact hole for exposing the surface of the semiconductor substrate between the two neighboring gate electrodes by patterning the interdielectric layer, and filling a conductive material in the contact hole. The gate electrodes may be formed of the structure of a polycide in which a silicide layer is formed on a polysilicon layer. The interdielectric layer may be formed of a boron phosphorus silicate glass (BPSG) layer, a spin on glass (SOG) layer, an undoped silicate glass (USG) layer, a silicon oxide layer formed by using a high density plasma-chemical vapor deposition (HDP-CVD) method, or a tetraethylorthosilicate (TEOS) layer formed by using a plasma enhanced-CVD (PE-CVD) method.

The method further includes the steps of forming a silicon oxide layer on the second etch stop layer, forming a silicon oxide layer pattern by etching a part of the silicon oxide layer so that the storage node hole may be formed, and removing the silicon oxide layer pattern during the formation of the node contact hole. The silicon oxide layer is preferably a silicon oxide layer formed by using a PE-CVD method, or a high temperature oxide layer.

The first insulating layer may be a silicon oxide layer formed by a HDP-CVD method, and the second insulating layer may be a TEOS layer formed by a PE-CVD method. The first etch stop layer and the second etch stop layer may be silicon nitride layers, respectively, formed by a low pressure-CVD (LP-CVD) method.

The thickness of the first insulating layer may be between 8000 and 12000 Å, and the thickness of the second insulating layer may be between 5000 and 20000 Å, and the thickness of the first etch stop layer and the second etch stop layer may be between 300 and 500 Å, respectively.

The step of forming a spacer includes the steps of forming a third insulating layer to have a thickness with which the storage node hole may not be completely filled, and etching-back the third insulating layer. The third insulating layer may be a silicon nitride layer or a silicon oxynitride layer formed by a PE-CVD method.

The step of removing the second etch stop layer pattern and the spacer is performed by removing the spacer after the removal of the second etch stop layer pattern, or by simultaneously removing the second etch stop layer pattern and the spacer.

The step of removing the second etch stop layer pattern and the spacer is performed by a wet etching method using a mixed solution of hydrogen peroxide, water ($H_2O$), and hydrofluoric acid (HF).

The step of forming a lower electrode includes the steps of forming a conductive layer having the thickness with which the storage node hole and the node contact hole may not be completely filled, on the entire surface of a resultant on which the node contact hole is formed, and forming a plurality of separated storage nodes by removing the top of the conductive layer and the second insulating layer pattern. The conductive layer may be formed of a polysilicon layer by diffusion. The step of forming a plurality of plurality storage nodes includes the steps of forming an oxide layer which fills the storage node hole and the node contact hole, on the conductive layer, removing a part of the oxide layer and the top of the conductive layer so that the second insulating layer pattern may be exposed, and removing the oxide layer which fills the storage node hole and the node contact hole, and the second insulating layer pattern by a wet-etching method. Preferably, the oxide layer is formed of a USG layer, a BPSG layer, a double layer of a silicon oxide layer and a USG layer, or a double layer of a silicon oxide layer and a BPSG layer.

The step of forming a lower electrode may further includes the step of forming hemispherical grains (HSGs) on the surface of the storage node.

The dielectric layer may be formed of a $Al_2O_3$ layer, a $Ta_2O_5$ layer, a $SrTiO_3$(STO) layer, (Ba, Sr) $TiO_3$(BST) layer, a $PbTiO_3$ layer, Pb(Zr, Ti)$O_3$(PZT) layer, a $SrBi_2Ta_2O_9$ (SBT) layer, (Pb,La)(Zr,Ti)$O_3$ layer, or $BaTiO_3$(BTO) layer. Alternatively, the dielectric layer may be formed of a triple layer of a silicon oxide layer, a silicon nitride layer, and a silicon oxide layer, or a double layer of a silicon nitride layer and a silicon oxide layer.

The upper electrode may be formed by using a polysilicon layer by diffusion.

According to the present invention, a photolithography process and a process for forming a conductive layer are each performed once, respectively. Thus, the overall fabrication process is simplified, and productivity is improved and production cost reduced.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF PREFERRED EMBODIMENTS

Figure 1:
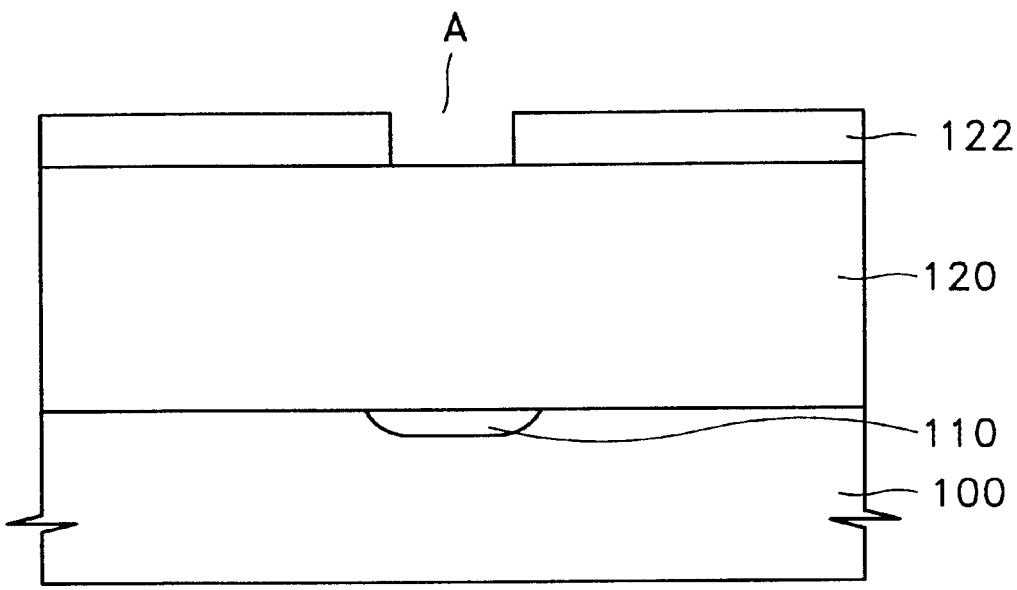
FIGS. 1 through 5 are sectional views illustrating a conventional method for fabricating a cylinder-type capacitor for a semiconductor device.
Figure 2:
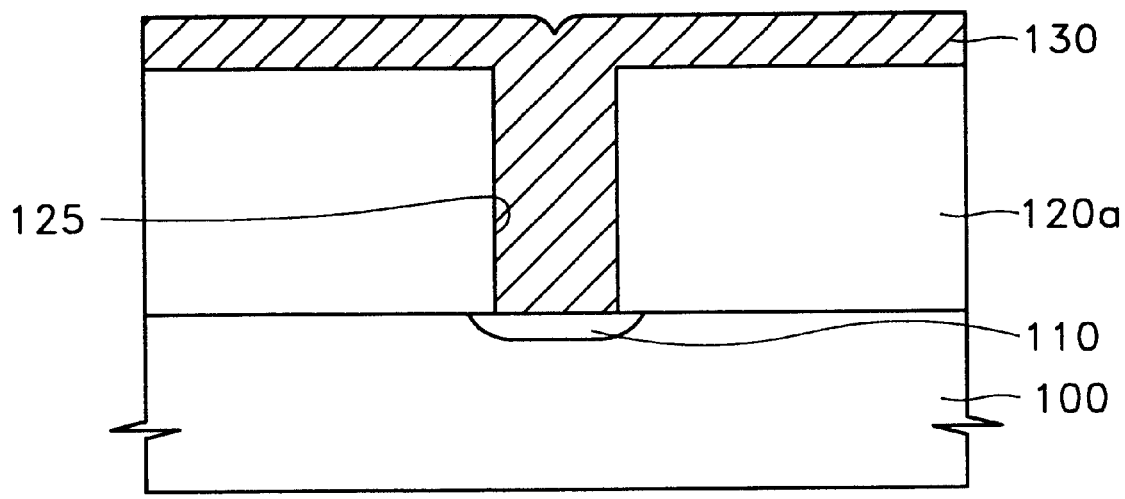
Figure 3:
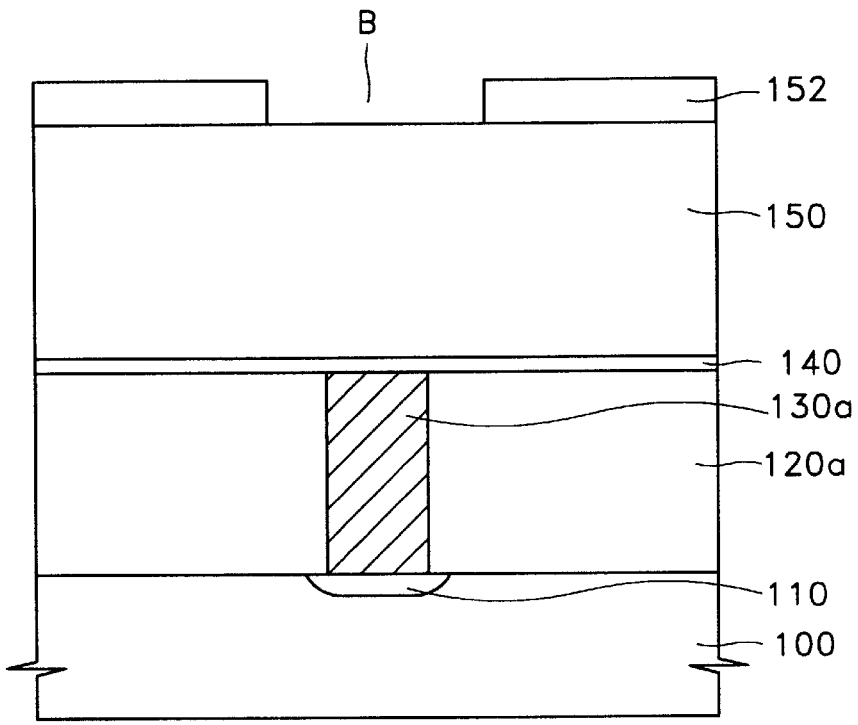
Figure 4:
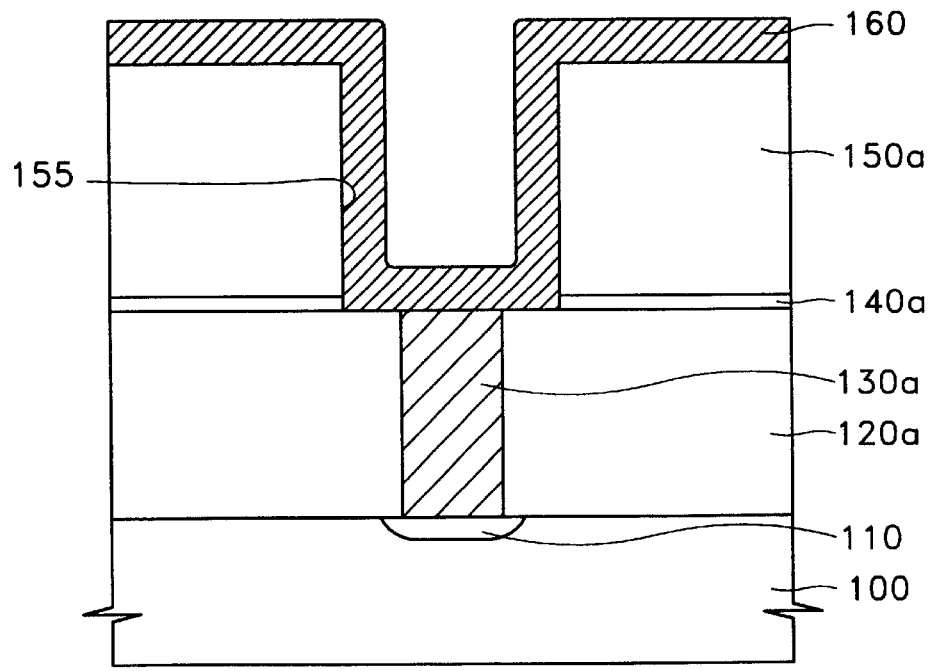

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer is referred to as being "on" another element or substrate, it can be directly on another element or substrate, or intervening elements may also be present. Like reference numerals refer to like elements throughout the drawings.

Embodiment 1

Figure 6:
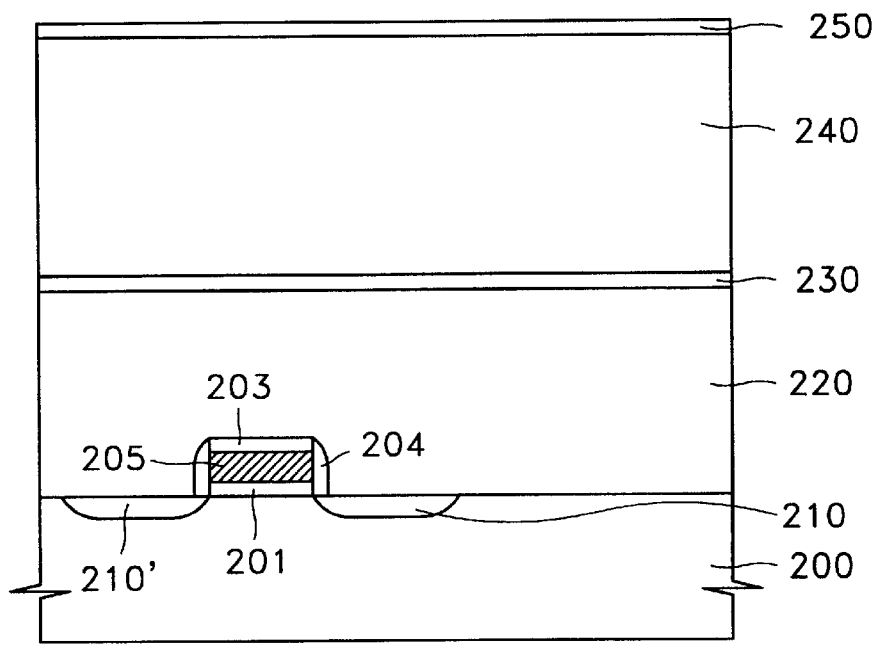
FIGS. 6 through 14 are sectional views illustrating a method for fabricating a cylinder-type capacitor for a semiconductor device according to a first embodiment of the present invention.

FIGS. 6 through 14 are sectional views illustrating a method for fabricating a cylinder-type capacitor of a semiconductor device according to a first embodiment of the present invention. Referring to FIG. 6, a gate insulating layer 201 is interposed between a semiconductor substrate 200 and a gate electrode 205. A capping layer 203 is formed on the top of the gate electrode 205, and a spacer for gate 204 is formed on the sidewall of the gate electrode 205. Impurity ions are implanted onto the semiconductor substrate 200 on which the gate electrode 205 is formed, and active regions 210 and 210' are formed on the surface of the semiconductor substrate 200. A first insulating layer 220, a first etch stop layer 230, a second insulating layer 240, and a second etch stop layer 250 are formed in sequence on the resultant structure on which the active regions 210 and 210' are formed.

The first insulating layer 220 and the second insulating layer 240 may be formed of the same layer, but, in this case, the second insulating layer 240 is formed of a material having a higher etching selectivity than that of the first insulating layer 220, so as to be easily removed during separation of storage nodes. For example, the first insulating layer 220 may be formed of a silicon oxide layer by a HDP-CVD method, and the second insulating layer 240 may be formed of a TEOS layer by a PE-CVD method.

The thickness of the first insulating layer 220 is decided by considering a lay-out of a device to be formed and, for example, may be between 8000 and 12000 Å. The thickness of the second insulating layer 240, for example, may be equal to or greater than the height of the storage node, considering the height of the storage node to be formed, or between 5000 and 20000 Å.

Preferably, the first etch stop layer 230 and the second etch stop layer 250 are formed of silicon nitride layers, respectively, by a LP-CVD method. Each thickness of the first etch stop layer 230 and the second etch stop layer 250 may be a thickness with which etching of the second insulating layer 240 and the first insulating layer 220 can be prevented. For example, the thickness of the first etch stop layer 230 and the second etch stop layer 250 can be between 300 and 500 Å, respectively.

Figure 7:
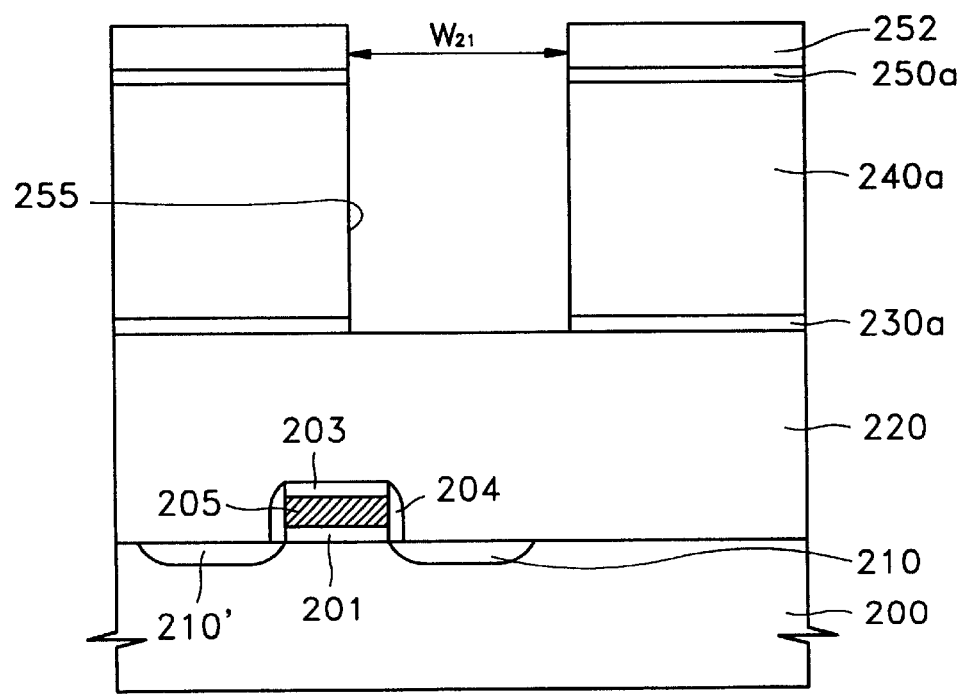

Referring to FIG. 7, a photoresist pattern 252 having an opening of a width $W_{21}$ at the position corresponding to one of the active regions 210 is formed on the second etch stop layer 250. The second etch stop layer 250, the second insulating layer 240, and the first etch stop layer 230 are etched by using the photoresist pattern 252 as a mask, and thereby, a second etch stop layer pattern 250a, a second insulating layer pattern 240a, and a first etch stop layer pattern 230a are formed so that a storage node hole 255 exposing the surface of a portion of the first insulating layer 220 is formed.

Figure 8:
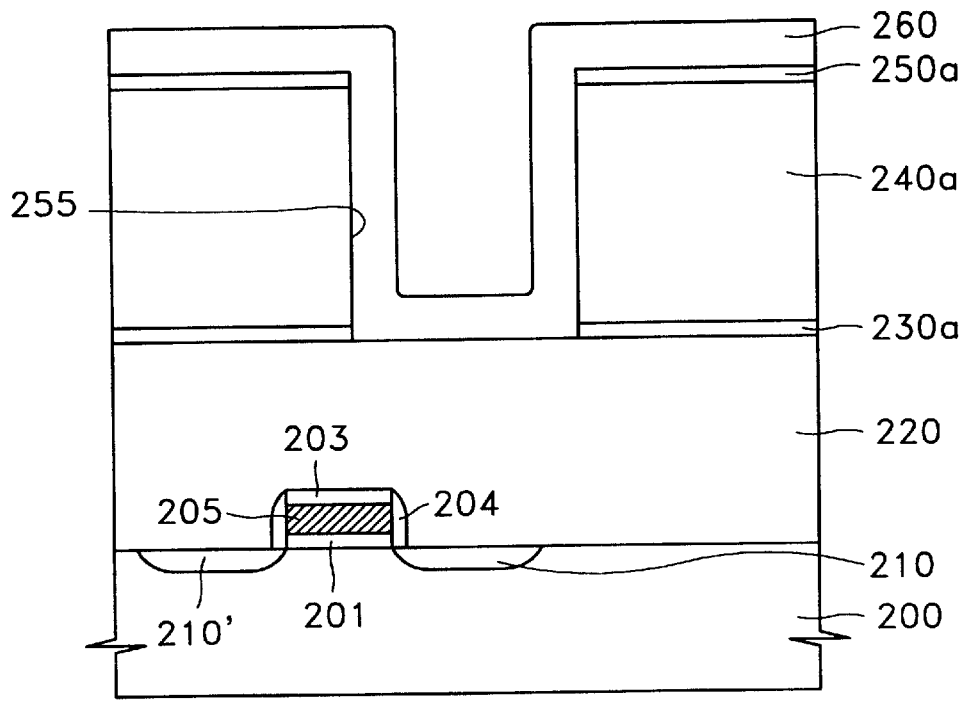

Referring to FIG. 8, after the photoresist pattern 252 is removed, a third insulating layer 260 is formed at a thickness such that the storage node hole 255 is not completely filled. Here, the third insulating layer 260 is formed of a silicon nitride layer or a silicon oxynitride layer by a PE-CVD method. The thickness of the third insulating layer 260 is decided by considering the width of a node contact hole to be formed in the first insulating layer 220.

Figure 9:
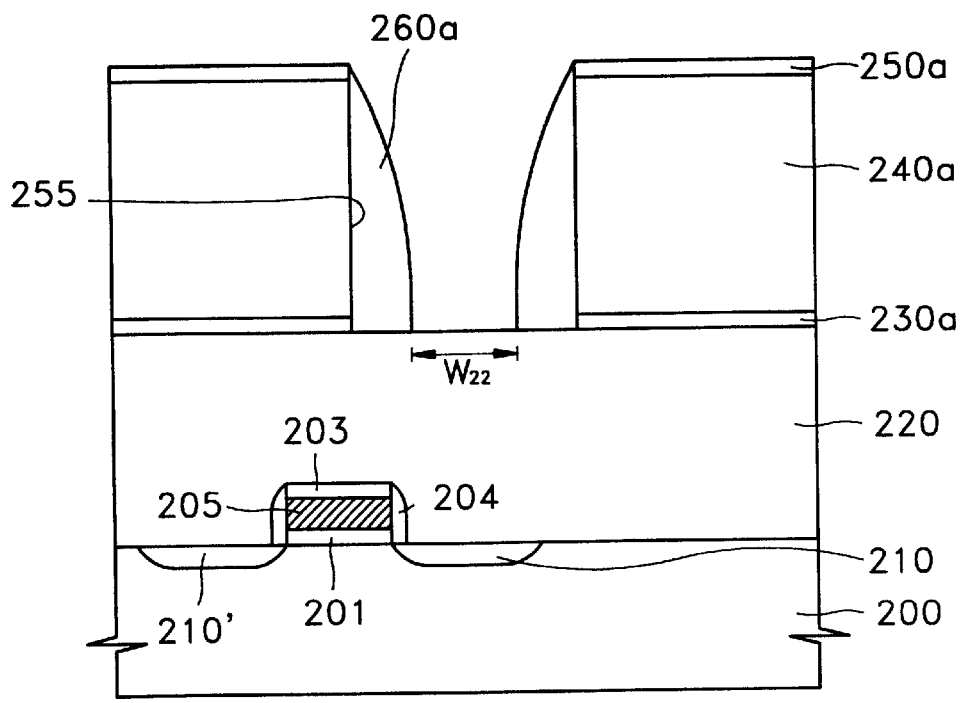

Referring to FIG. 9, a spacer 260a is formed on an inner wall of the storage node hole 255 by etching-back the third insulating layer 260. Here, the surface of the top of the first insulating layer 220 is exposed to the width $W_{22}$ ($W_{22} < W_{21}$).

Figure 10:
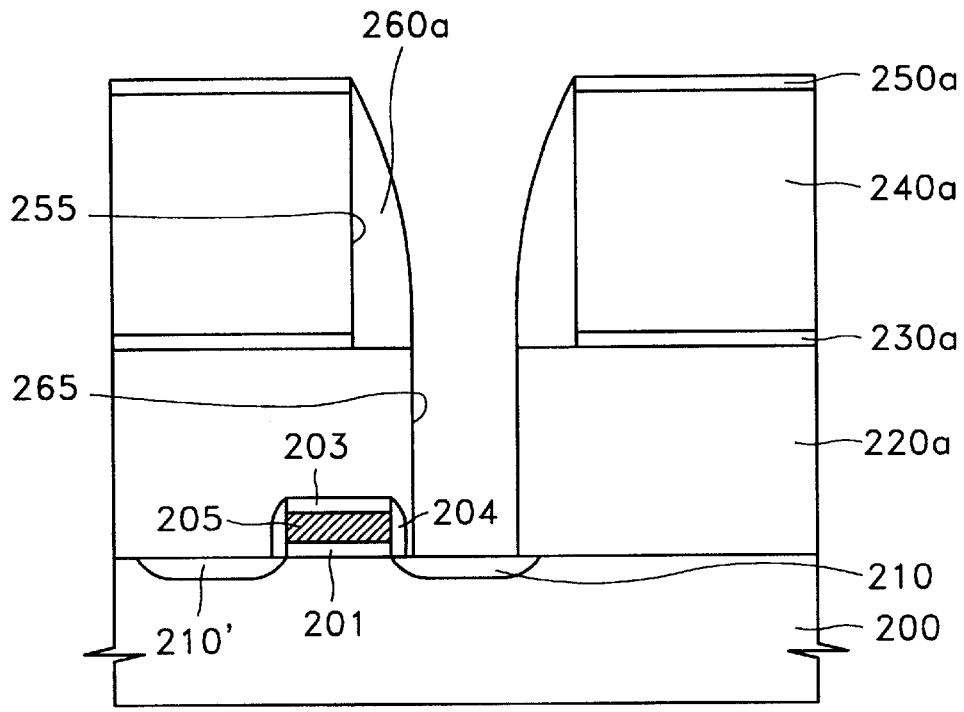

Referring to FIG. 10, the exposed first insulating layer 220 is etched by using the second etch stop layer pattern 250a and the spacer 260a as a mask, and a first insulating layer pattern 220a is formed, having a node contact hole 265 in which a surface of a portion of the active region 210 is exposed.

Figure 11:
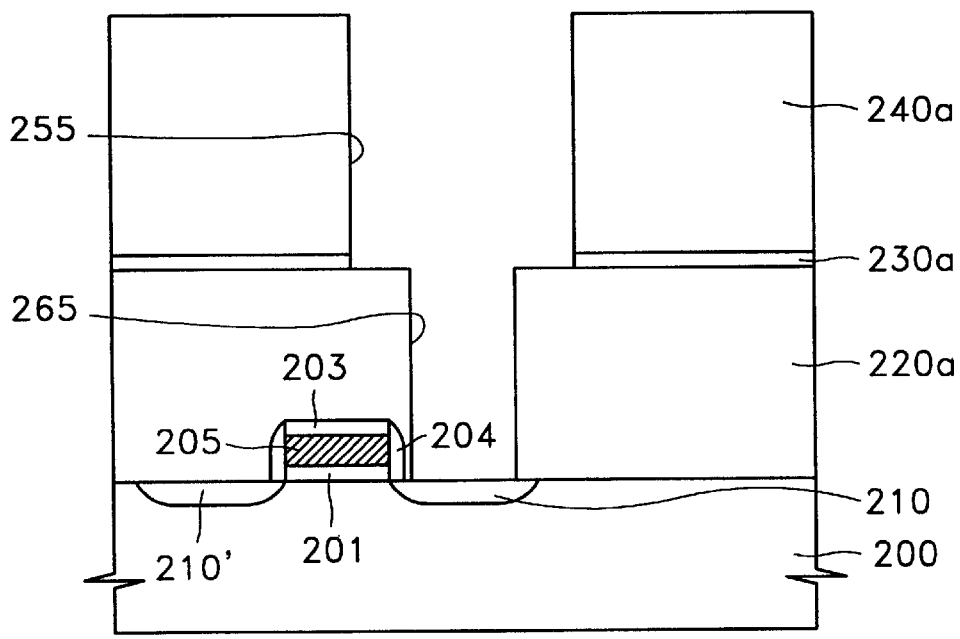

Referring to FIG. 11, the second etch stop layer pattern 250a and the spacer 260a are removed. The second etch stop layer pattern 250a may be removed during the process described with reference to FIGS. 9 and 10. If a portion, or all, of the second etch stop layer pattern 250a remains, even following the process described in FIGS. 9 and 10, then the second etch stop layer pattern 250a is removed with the spacer 260a. That is, an additional removal step is performed, for removing the second etch stop layer pattern 250a and the spacer 260a. This removal step can be performed by removing the spacer 260a after removal of the second etch stop layer pattern 250a, or by simultaneously removing the second etch stop layer pattern 250a and the spacer 260a. An etching solution or etching gas having a high etching selectivity with respect to the spacer 260a, as compared to the first insulating layer pattern 220a, the second insulating layer pattern 240a, and the semiconductor substrate 200, is preferably used in the step of removing the second etch stop layer pattern 250a and the spacer 260a. For example, the step of removing the second etch stop layer pattern 250a and the spacer 260a may be performed by a wet etching method using an etching solution containing hydrogen peroxide, water, and hydrofluoric acid. A high degree of etching selectivity of the etching solution or etching gas is preferred for avoiding deterioration of the second insulator layer pattern 240, and thereby maintaining adequate height in the storage node, and avoiding a reduction in capacitance.

Figure 12:
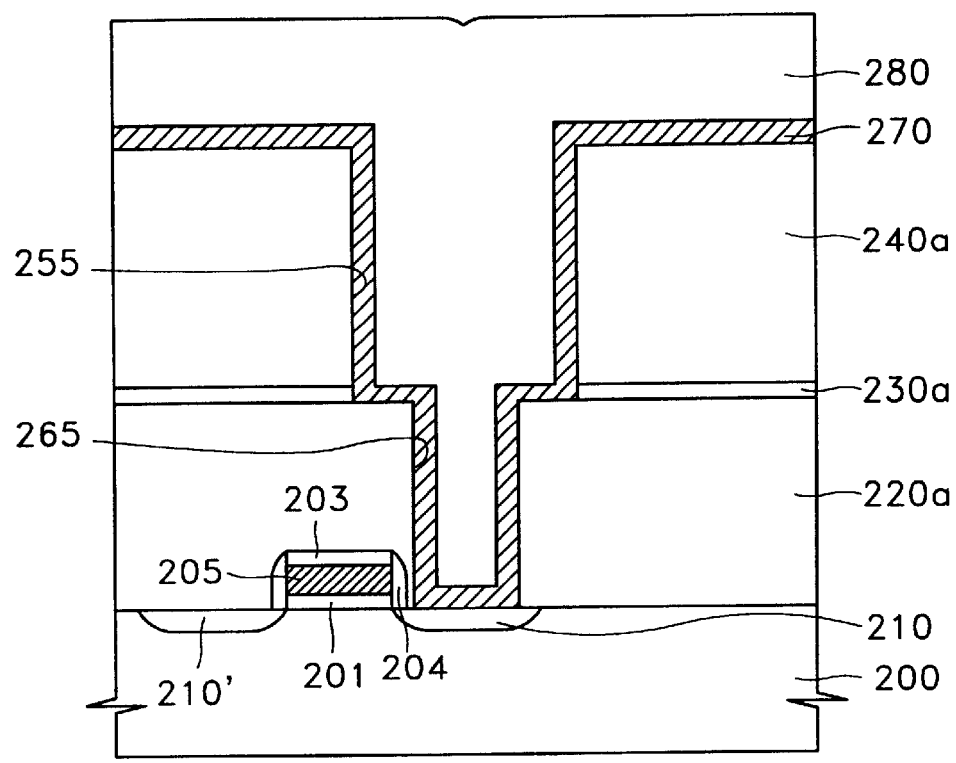

Referring to FIG. 12, a conductive layer 270 having appropriate thickness so as to avoid completely filling the storage node hole 255 and the node contact hole 265, is formed on the entire surface of a resultant structure shown in FIG. 11. Preferably, the conductive layer 270 is formed of a polysilicon layer by diffusion. An oxide layer 280 which fills the storage node hole 255 and the node contact hole 265 is formed on the conductive layer 270. Here, the oxide layer 280 is preferably formed of a USG layer, a BPSG layer, a double layer of a silicon oxide layer and a USG layer, or a double layer of a silicon oxide layer and a BPSG layer. If a silicon oxide layer having a high etching durability is formed before forming the USG layer or the BPSG layer, and the oxide layer 280 is formed of a double layer of a silicon oxide layer and a USG layer, or a double layer of a silicon oxide layer and a BPSG layer, the active region 210 can be prevented from being etched.

Figure 13:
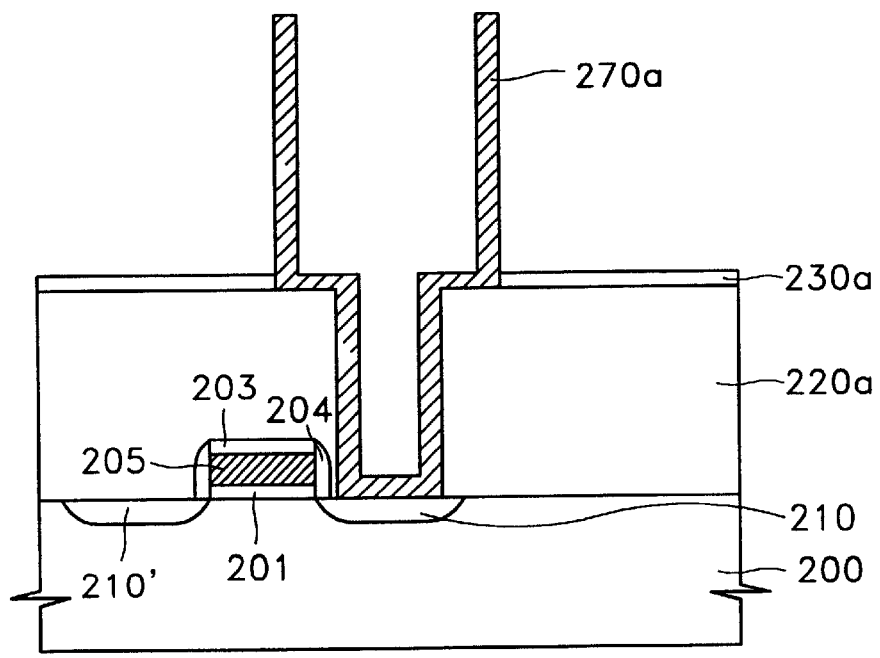

Referring to FIG. 13, a part of the oxide layer 280 and the top of the conductive layer 270 are removed by etching-back or, chemical mechanical polishing (CMP), the upper surface of the resultant structure shown in FIG. 12 so that the second insulating layer pattern 240a may be exposed. A separated storage node 270a is formed by removing the oxide layer 280 filling the storage node hole 255 and the node contact hole 265, and removing the second insulating layer pattern 240a, by wet etching. The storage node 270a forms a lower electrode of a cylinder-type capacitor.

Figure 14:
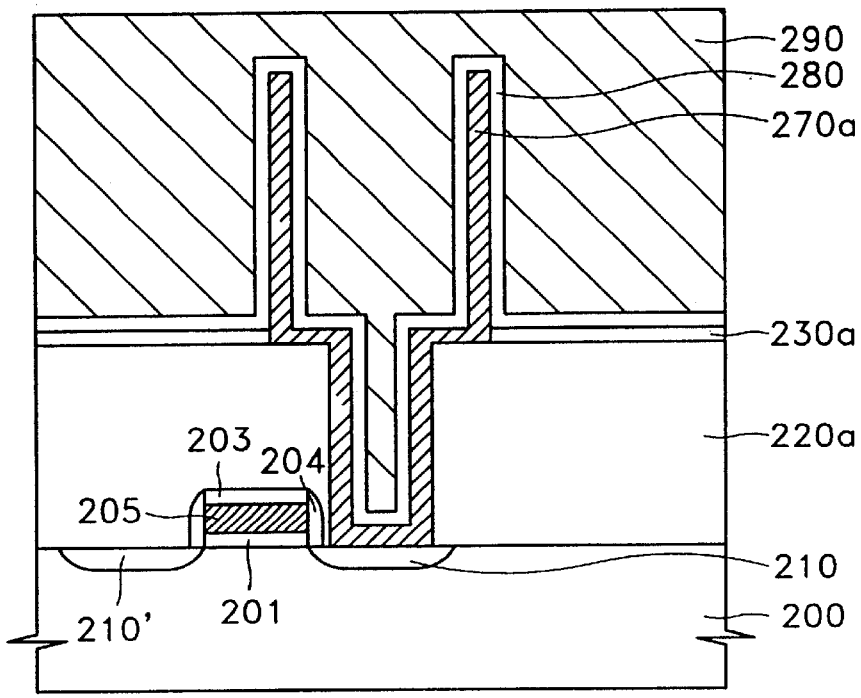

Referring to FIG. 14, a dielectric layer 280 and an upper electrode 290 are formed on the storage node 270a. The dielectric layer 280 is, for example, formed of a $Al_2O_3$ layer, a $Ta_2O_5$ layer, a STO layer, a BST layer, a $PbTiO_3$ layer, a PZT layer, a SBT layer, a $(Pb,La)(Zr,Ti)O_3$ layer, or a BTO layer. Alternatively, the dielectric layer 280 may be formed of a triple layer of a silicon oxide layer, a silicon nitride layer, and a silicon oxide layer, or a double layer of a silicon nitride layer and a silicon oxide layer. The upper layer 290 is preferably formed of a polysilicon layer by diffusion.

Figure 5:
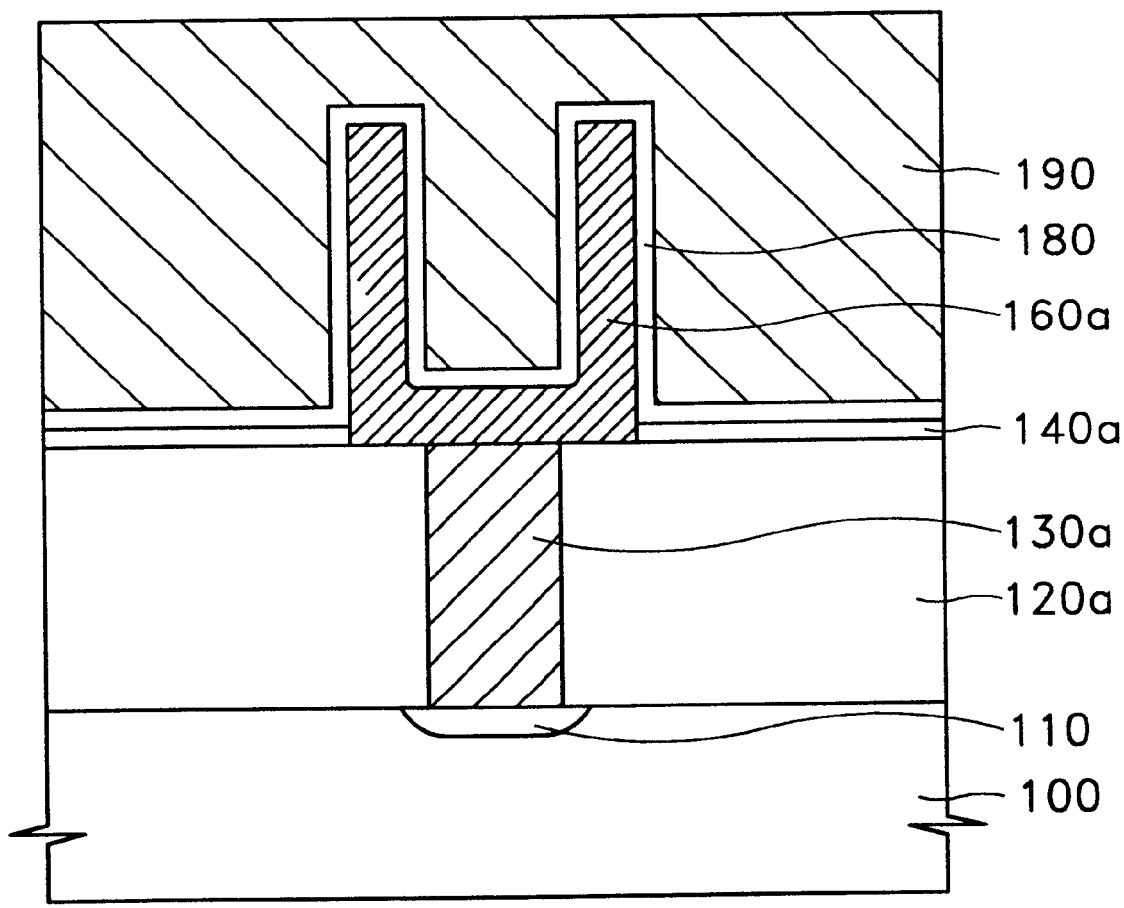

According to the embodiment described above, a photolithography process and a process for forming a conductive layer are performed once, respectively, and then processes are simplified. Comparing the resulting structure of FIG. 14 with the conventional structure of FIG. 5, in FIG. 14, the effective surface area of the capacitor electrode increases. Thus, a capacitor having improved capacitance can be fabricated.

Embodiment 2

Figure 15:
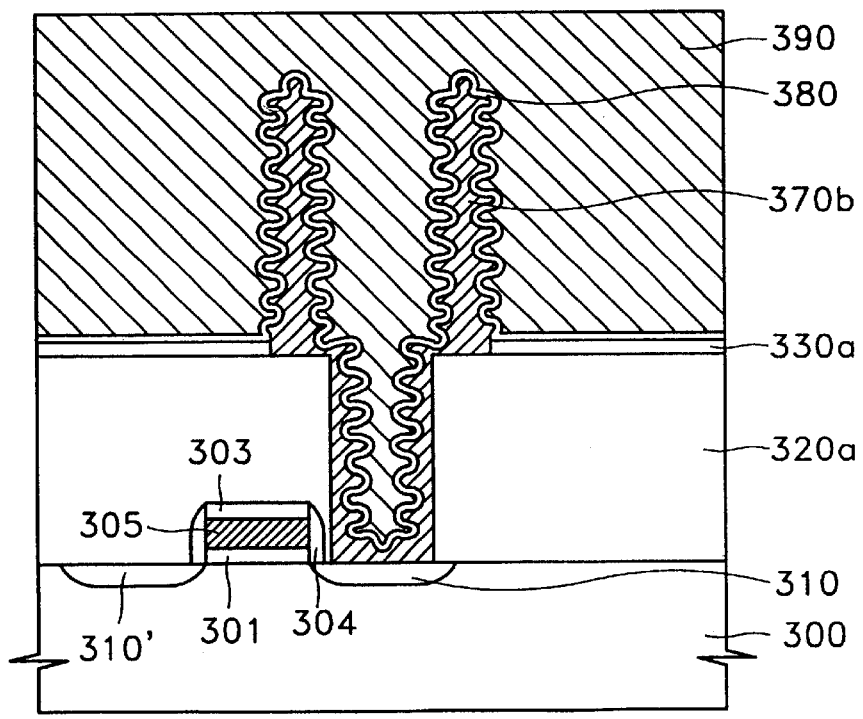
FIG. 15 is a sectional view illustrating a method for fabricating a cylinder-type capacitor for a semiconductor device according to a second embodiment of the present invention.

FIG. 15 is a sectional view illustrating the method for fabricating a cylinder-type capacitor of a semiconductor device according to a second embodiment of the present invention. Referring to FIG. 15, a gate insulating layer 301 is interposed between a semiconductor substrate 300 and a gate electrode 305. A capping layer 303 is formed on the top of the gate electrode 305, and a spacer for gate 304 is formed on the sidewall of the gate electrode 305. Active regions 310 and 310' are formed on the surface of the semiconductor substrate 300 on which the gate electrode 305 is formed. A first insulating layer pattern 320a, and a first etch stop layer pattern 330a are formed on the resultant structure on which the active regions 310 and 310' are formed. A storage node interfacing with the first etch stop layer pattern 330a, the first insulating layer pattern 320a, and the active region 310, is formed. In order to improve capacitance, HSGs are formed on the surface of the storage node, and thereby completing a lower electrode 370b. A dielectric layer 380 and an upper electrode 390 are formed on the lower electrode 370b. Other processes beyond the process for forming HSGs are the same as those in the first embodiment, so a description thereof will be omitted.

Embodiment 3

Figure 16:
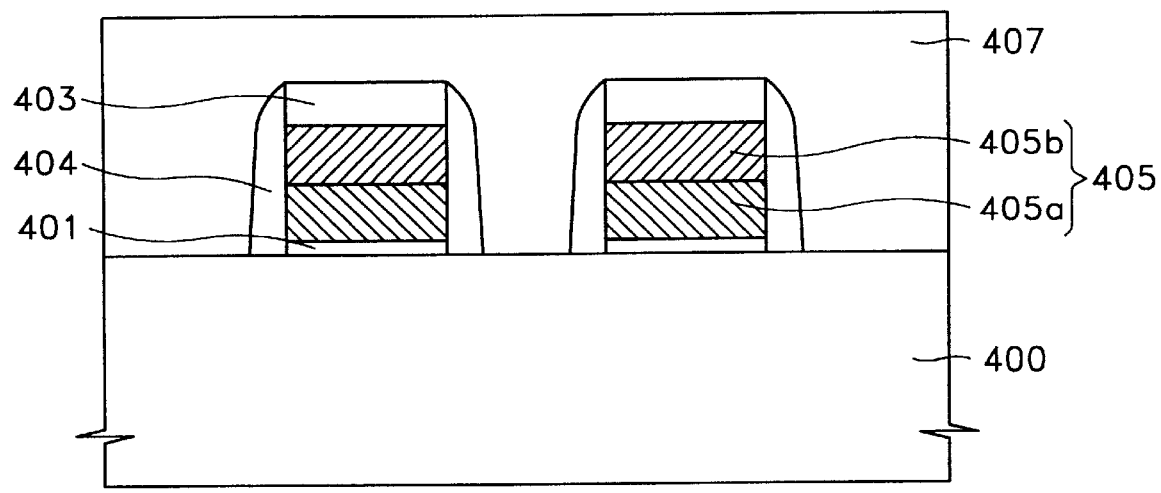
FIGS. 16 through 18 are sectional views illustrating a method for fabricating a cylinder-type capacitor for a semiconductor device according to a third embodiment of the present invention.
Figure 17:
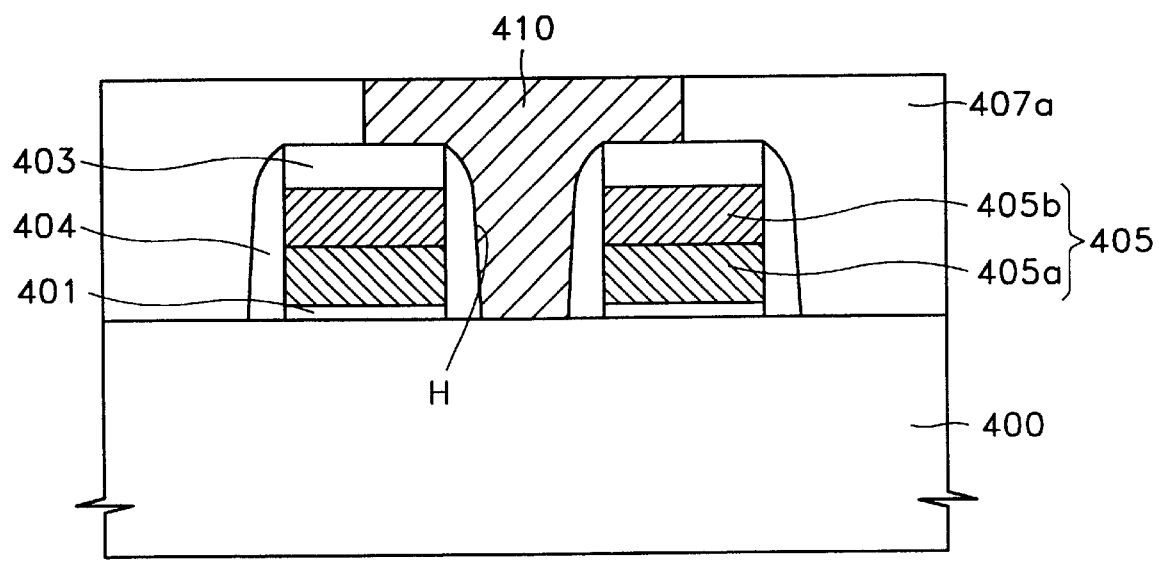
Figure 18:
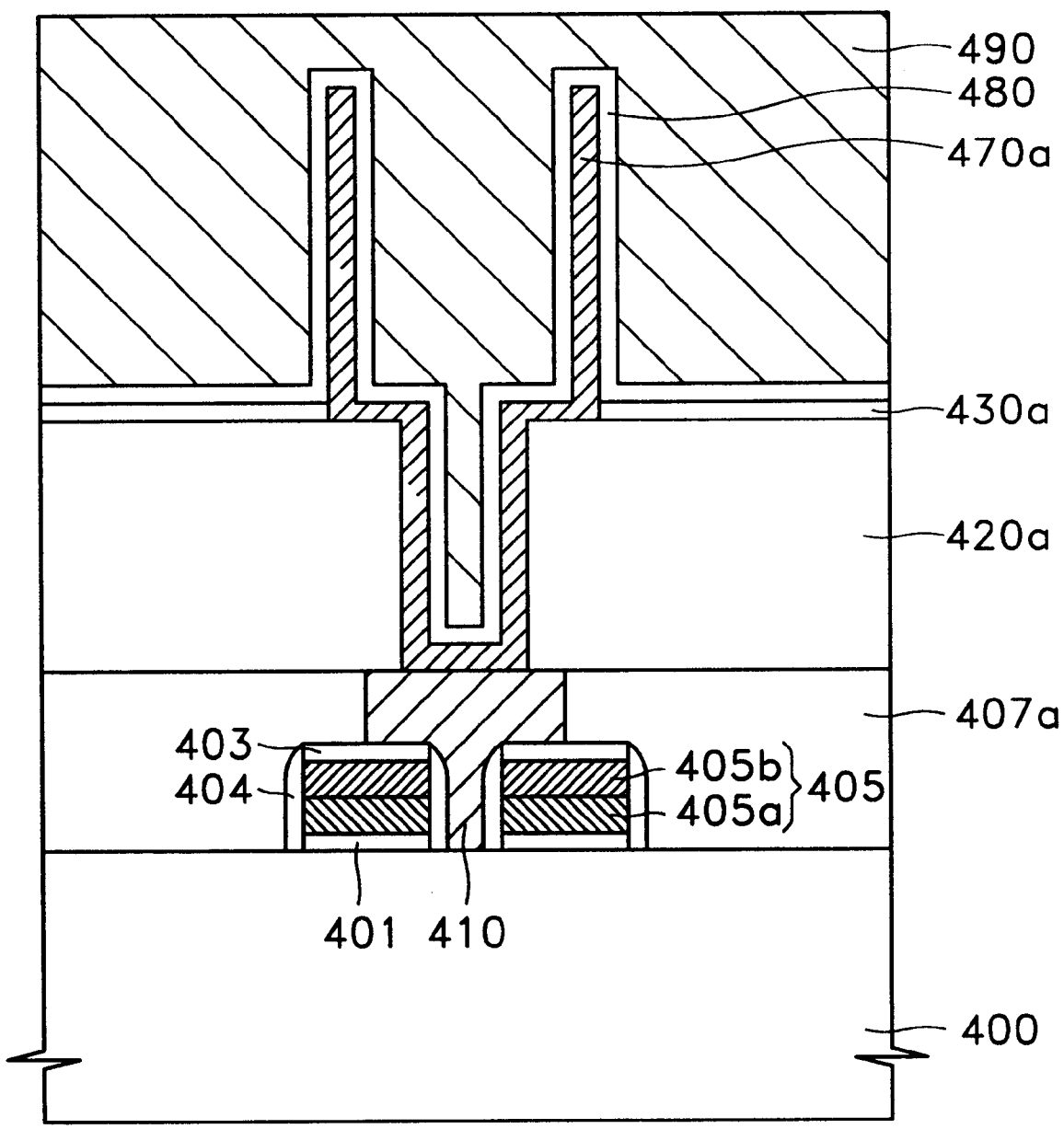

FIGS. 16 through 18 are sectional views illustrating a method for fabricating a cylinder-type capacitor of a semiconductor device according to a third embodiment of the present invention. Referring to FIG. 16, a plurality of gate electrodes 405 are formed on a semiconductor substrate 400. A gate insulating layer 401 is interposed under the gate electrodes 405. A capping layer 403 is formed on the top of the gate electrodes 405, and a spacer for gate 404 is formed on sidewalls of the gate electrodes 405. The gate electrodes 405 may be formed of the structures of a polycide in which polysilicon layers 405a and silicide layers 405b, for example, tungsten silicide layers, are formed in sequence. An interdielectric layer 407 which fills a space between the plurality of gate electrodes 405 is formed. The interdielectric layer 407 may be formed of a BPSG layer, a SOG layer, a USG layer, a silicon oxide layer formed by using a HDP-CVD method, or a TEOS layer formed by using a PE-CVD method.

Referring to FIG. 17, a photoresist pattern (not shown) is formed on the interdielectric layer 407, and the interdielectric layer 407 is patterned by using the photoresist pattern as a mask. As a result, an interdielectric layer pattern 407a having a contact hole H for exposing the surface of the semiconductor substrate 400 between the two neighboring gate electrodes 405 is formed. A contact pad 410 is formed by filling a conductive material in the contact hole H.

Referring to FIG. 18, a first insulating layer pattern 420a and a first etch stop layer pattern 430a are formed on the resultant structure on which the contact pad 410 is formed. A storage node 470a interfacing with the first etch stop layer pattern 430a, the first insulating layer pattern 420a, and the contact pad 410 is formed. A dielectric layer 480 and an upper electrode 490 are formed on the storage node 470a. Other processes are the same as those in the first embodiment, so a description thereof will be omitted.

Embodiment 4

Figure 19:
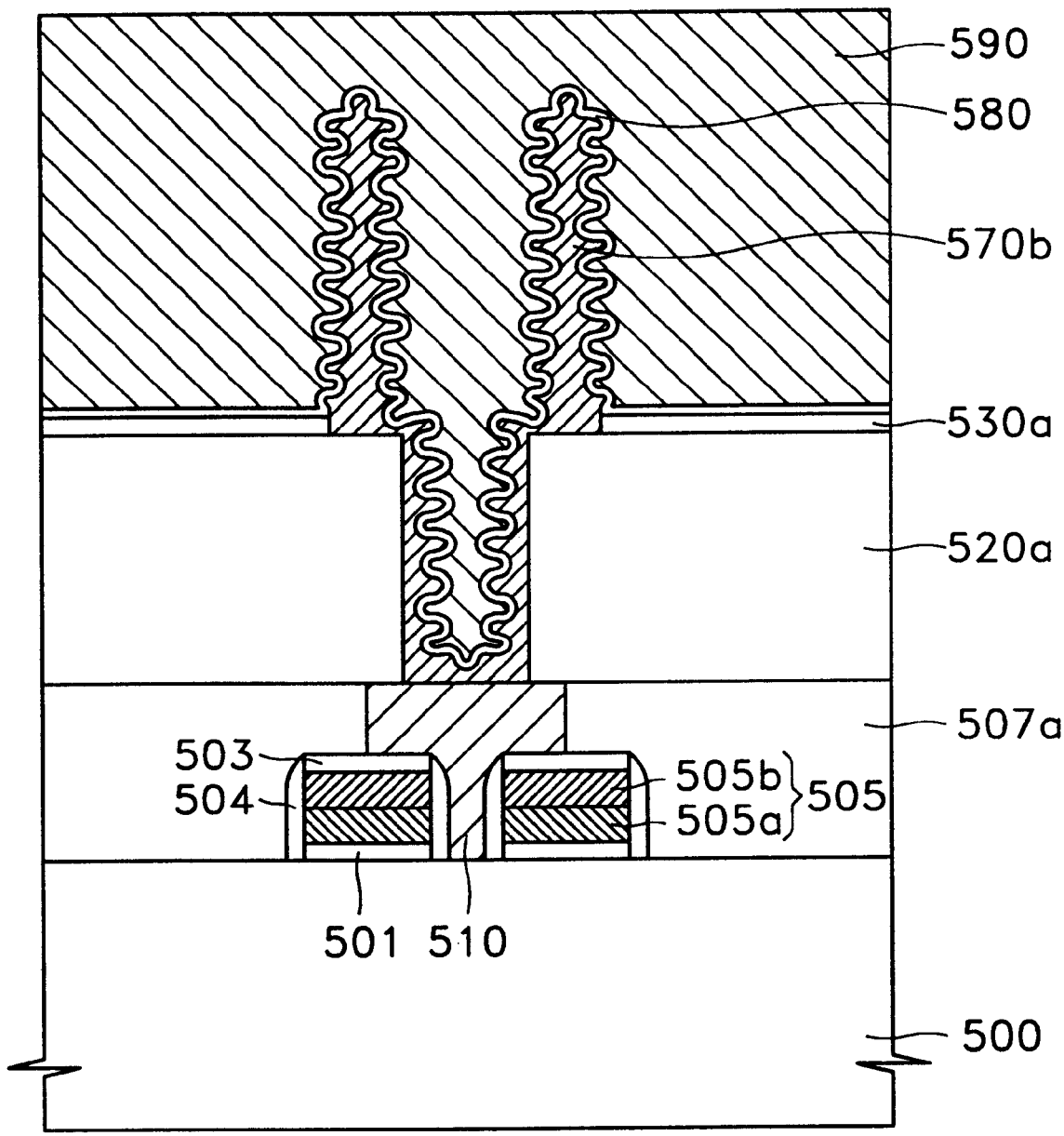
FIG. 19 is a sectional view illustrating a method for fabricating a cylinder-type capacitor for a semiconductor device according to a fourth embodiment of the present invention.

FIG. 19 is a sectional view illustrating the method for fabricating a cylinder-type capacitor of a semiconductor device according to a fourth embodiment of the present invention. Referring to FIG. 19, a gate insulating layer 501 is interposed between a semiconductor substrate 500 and a gate electrode 505. A capping layer 503 is formed on the top of the gate electrode 505, and a spacer for gate 504 is formed on the sidewall of the gate electrode 505. The gate electrodes 505 are formed of a polysilicon layer 505a and a silicide layer 505b, in sequence, for example, of the structure of a polycide in which a tungsten silicide layer is formed. A first insulating layer pattern 507a and a contact pad 510 are formed on the resultant structure on which the gate electrodes 505 are formed. A first insulating layer pattern 520a and a first etch stop layer pattern 530a are formed on the resultant structure on which the contact pad 510 is formed. A storage node interfacing with the first etch stop layer pattern 530a, the first insulating layer pattern 520a, and the contact pad 510 is formed. In order to improve capacitance, HSGs are formed on the surface of the storage node, and thereby completing a lower electrode 570b. A dielectric layer 580 and an upper electrode 590 are formed on the lower electrode 570b. Processes beyond the formation of HSGs are the same as those in the third embodiment, so a description thereof will be omitted.

Embodiment 5

Figure 20:
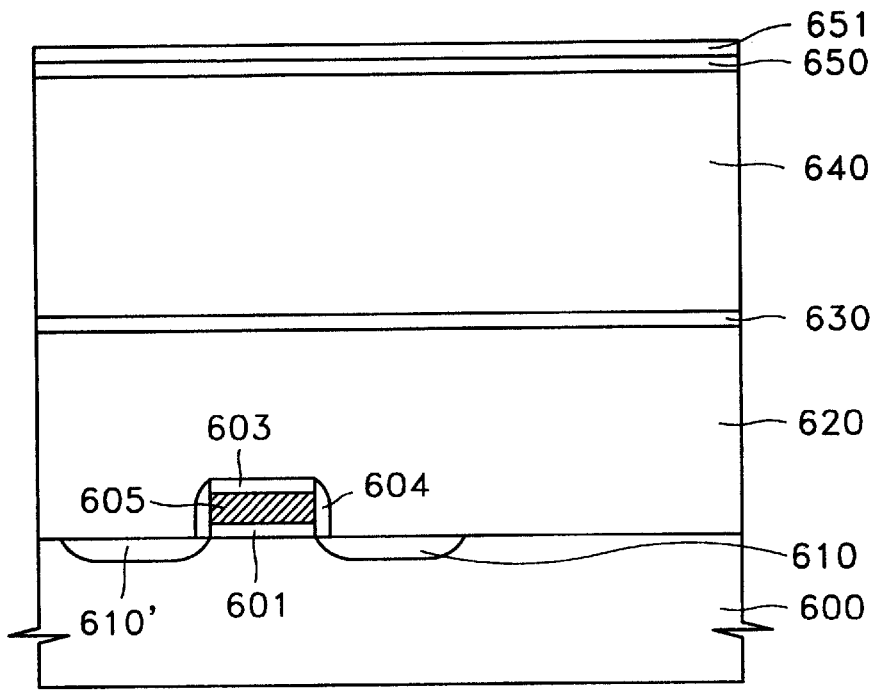
FIGS. 20 through 24 are sectional views illustrating a method for fabricating a cylinder-type capacitor for a semiconductor device according to a fifth embodiment of the present invention.

FIGS. 20 through 24 are sectional views illustrating a method for fabricating a cylinder-type capacitor of a semiconductor device according to a fifth embodiment of the present invention. Referring to FIG. 20, a gate insulating layer 601 is interposed between a semiconductor substrate 600 and a gate electrode 605. A capping layer 603 is formed on the top of the gate electrode 605, and a spacer for gate 604 is formed on the sidewall of the gate electrode 605. Active regions 610 and 610' are formed on the surface of the semiconductor substrate 600 on which the gate electrode 605 is formed. A first insulating layer 620, a first etch stop layer 630, a second insulating layer 640, and a second etch stop layer 650 are formed in sequence on the resulting structure on which the active regions 610 and 610' are formed. A silicon oxide layer 651 is formed on the second etch stop layer 650. Here, the silicon oxide layer 651 may comprise a silicon oxide layer formed by using a PE-CVD method, or a high temperature oxide layer.

Figure 21:
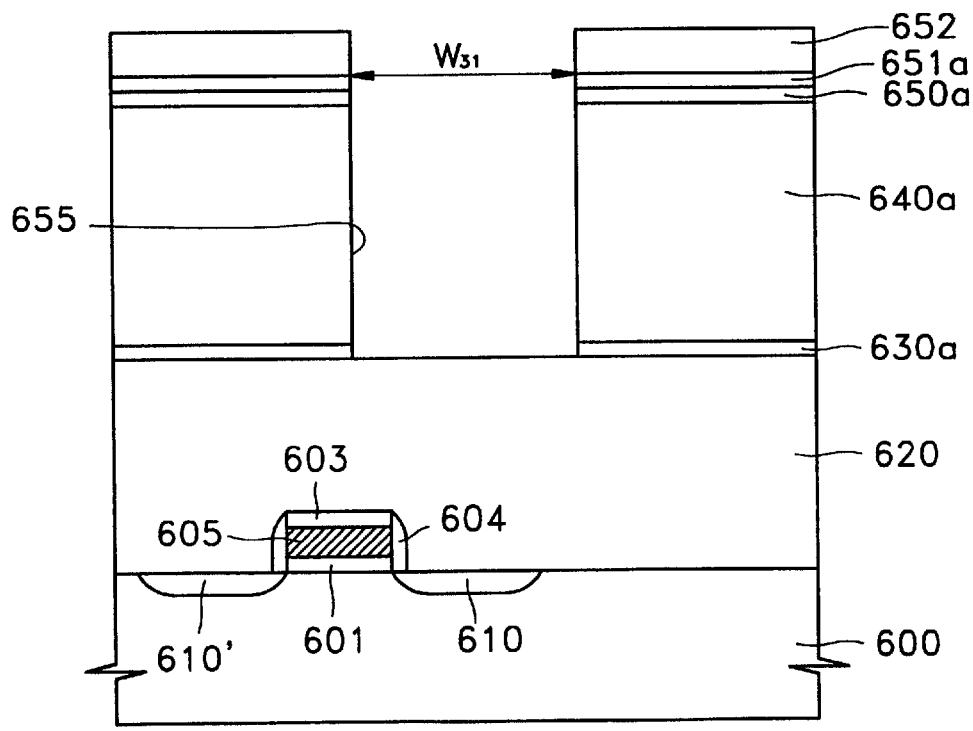

Referring to FIG. 21, a photoresist pattern 652 having an opening of width $W_{31}$ is formed at a position corresponding to active region 610 on the silicon oxide layer 651. The silicon oxide layer 651, the second etch stop layer 650, the second insulating layer 640, and the first etch stop layer 630 are etched by using the photoresist pattern 652 as a mask, and thereby, a silicon oxide layer pattern 651a, a second etch stop layer pattern 650a, a second insulating layer pattern 640a, and a first etch stop layer pattern 630a having a storage node hole 655 for exposing the surface of a portion of the first insulating layer 620 are formed.

Figure 22:
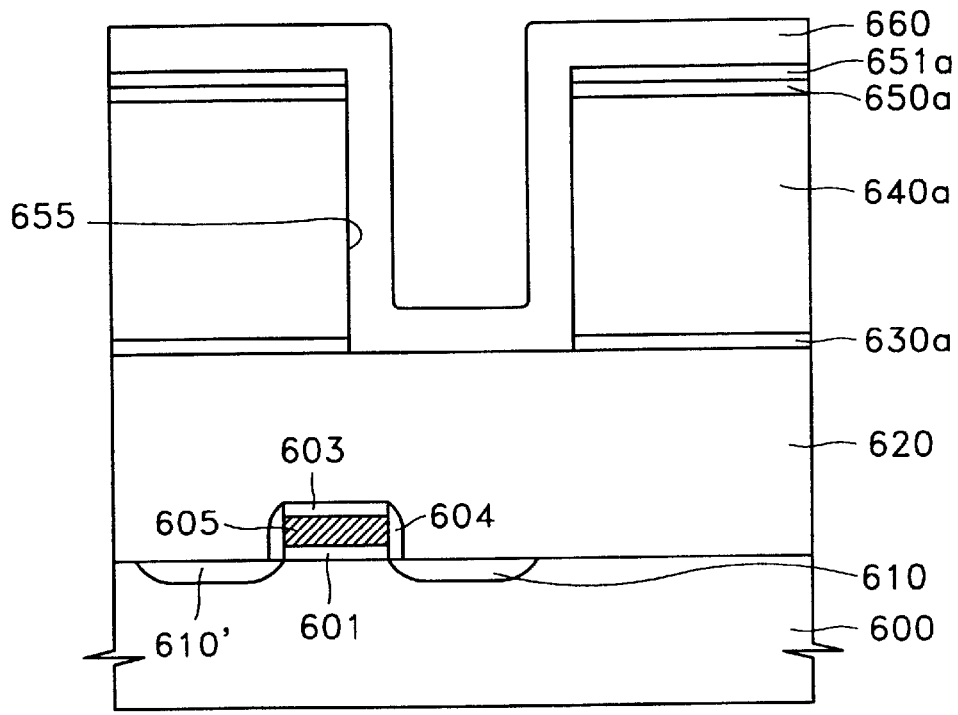

Referring to FIG. 22, after the photoresist pattern 652 is removed, a third insulating layer 660 having a suitable thickness such that the storage node hole 655 is not completely filled is formed. Here, the third insulating layer 660 is preferably formed of a silicon nitride layer or a silicon oxynitride layer by a PE-CVD method.

Figure 23:
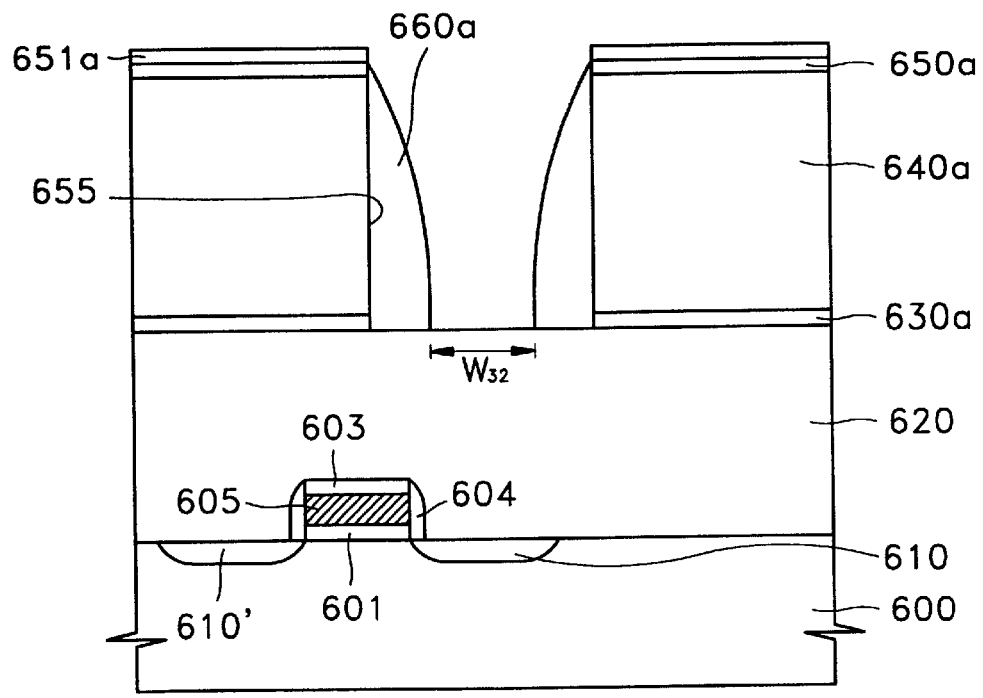

Referring to FIG. 23, a spacer 660a is formed on an inner wall of the storage node hole 655 by etching-back the third insulating layer 660. Here, the first insulating layer 620 is exposed to the width $W_{32}$. In a case where it is necessary to remove a silicon nitride layer or silicon oxynitride layer on the exposed surface of the first insulating layer 620, a process for treating a residue having no selectivity is performed. Here, the silicon oxide layer pattern 651 a protects the second etch stop layer pattern 650a. If the second etch stop layer pattern 650a is removed, the second insulating layer pattern 640a is etched in the subsequent process for forming a node contact hole, and the height of the storage node is reduced. This causes the capacitance of the resulting capacitor to be reduced. The silicon oxide layer pattern 651 a prevents this problem. The silicon oxide layer pattern 651 a can optionally be removed during the process for treating a residue, or alternatively remain on the structure.

Figure 24:
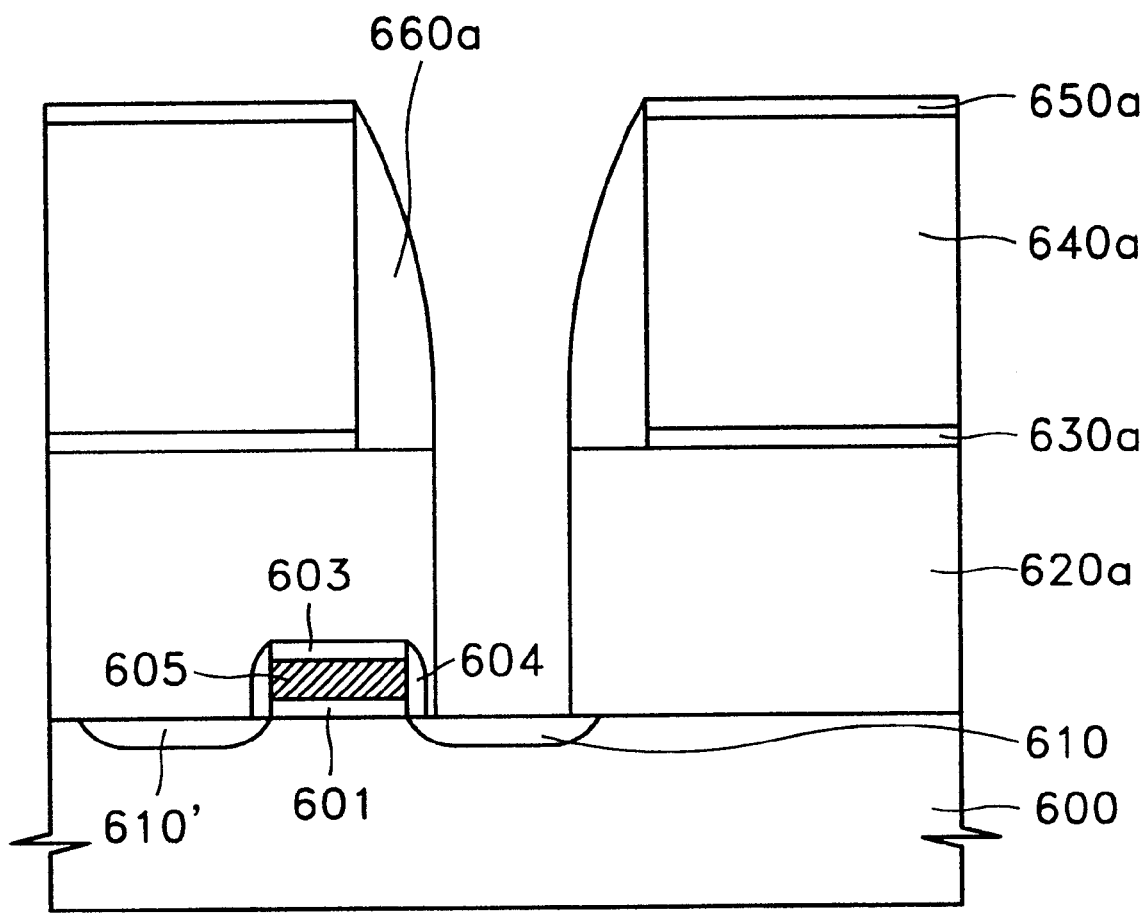

Referring to FIG. 24, the exposed first insulating layer 620 is etched by using the second etch stop layer pattern 650a and the spacer 660a as a mask, and a first insulating layer pattern 620a is formed, having a node contact hole 665 in which the surface of a part of the active region 610 is exposed. The silicon oxide layer pattern 651a remaining after the process for treating a residue, and the first insulating layer 620, are the same material layers, so the silicon oxide layer pattern 651a is completely removed during this step. After that, processes described with reference to FIGS. 11 through 14, or processes for obtaining a resultant of FIG. 15 will be performed.

According to the present invention, a storage node hole is formed under a single photolithography process, and a single process for forming a conductive layer is performed following formation of a node contact hole using a spacer. This is in contrast with the conventional approach illustrated above, which requires dual photolithography processes and dual processes for forming a conductive layer. Thus, the overall fabrication process is simplified, and thereby productivity is improved and production cost reduced. Since a contact plug of a cylinder-type capacitor according to the prior art can be used as a lower electrode of a capacitor, the effective area of the capacitor electrode increases, thereby improving the capacitance of the capacitor.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for fabricating a cylinder-type semiconductor device capacitor comprising:

forming in sequence a first insulating layer, a first etch stop layer, a second insulating layer, and a second etch stop layer on a semiconductor substrate including a conductive region;

forming a second etch stop layer pattern, a second insulating layer pattern, and a first etch stop layer pattern by etching a portion of the second etch stop layer, the second insulating layer, and the first etch stop layer, to form a storage node hole exposing a surface of a portion of the first insulating layer;

forming a spacer on an inner wall of the storage node hole;

forming a first insulating layer pattern by etching an exposed potion of the first insulating layer using the second etch stop layer pattern and the spacer as a mask, to form a node contact hole exposing the conductive region;

removing the second etch stop layer pattern and the spacer;

forming a lower electrode facing the first etch stop layer pattern, the first insulating layer pattern, and the conductive region; and forming a dielectric layer and an upper electrode on the lower electrode.

2. The method according to claim 1, wherein the conductive region is an active region on the surface of the semiconductor substrate, or a contact pad on the top of the semiconductor substrate.

3. The method according to claim 1, wherein the method further comprises forming a contact pad self-aligned by two neighboring gate electrodes formed on the semiconductor substrate, and wherein the conductive region is the contact pad.

4. The method according to claim 3, wherein the step of forming a contact pad comprises the steps of:

forming an interdielectric layer which fills a space between the two gate electrodes;

forming a contact hole for exposing the surface of the semiconductor substrate between the two neighboring gate electrodes by patterning the interdielectric layer; and filling a conductive material in the contact hole.

5. The method according to claim 4, wherein the gate electrodes are formed of the structure of a polycide in which a suicide layer is formed on a polysilicon layer.

6. The method according to claim 4, wherein the interdielectric layer is formed of a boron phosphorus silicate glass (BPSG) layer, a spin on glass (SOG) layer, an undoped silicate glass (USG) layer, a silicon oxide layer formed by using a high density plasma-chemical vapor deposition (HDP-CVD) method, or a tetraethylorthosilicate (TEOS) layer formed by using a plasma enhanced-CVD (PE-CVD) method.

7. The method according to claim 1, wherein the first insulating layer is a silicon oxide layer.

8. The method according to claim 7, wherein the first insulating layer is formed by a HDP-CVD method.

9. The method according to claim 1, wherein the second insulating layer is a TEOS layer.

10. The method according to claim 9, wherein the second insulating layer is formed by a PE-CVD method.

11. The method according to claim 1, wherein the first etch stop layer and the second etch stop layer are silicon nitride layers, respectively.

12. The method according to claim 11, wherein the first etch stop layer and the second etch stop layer are formed by a low pressure-CVD (LP-CVD) method.

13. The method according to claim 1, wherein the thickness of the first insulating layer is between 8000 and 12000 Å.

14. The method according to claim 1, wherein the thickness of the second insulating layer is between 5000 and 20000 Å.

15. The method according to claim 1, wherein the thickness of the first etch stop layer and the second etch stop layer are between 300 and 500 Å, respectively.

16. The method according to claim 1 further comprising the steps of:

forming a silicon oxide layer on the second etch stop layer;

forming a silicon oxide layer pattern by etching a part of the silicon oxide layer so that the storage node hole may be formed; and removing the silicon oxide layer pattern during the formation of the node contact hole.

17. The method according to claim 16, wherein the silicon oxide layer is a silicon oxide layer formed by using a PE-CVD method, or a high temperature oxide layer.

18. The method according to claim 1, wherein the step of forming a spacer comprises the steps of:
   forming a third insulating layer at a thickness at which the storage node hole is coated and not filled; and
   etching-back the third insulating layer.

19. The method according to claim 18, wherein the third insulating layer is a silicon nitride layer or a silicon oxynitride layer.

20. The method according to claim 19, wherein the third insulating layer is formed by a PE-CVD method.

21. The method according to claim 1, wherein the step of removing the second etch stop layer pattern and the spacer is performed by removing the spacer after the removal of the second etch stop layer pattern.

22. The method according to claim 1, wherein the step of removing the second etch stop layer pattern and the spacer is performed by simultaneously removing the second etch stop layer pattern and the spacer.

23. The method according to claim 1, wherein the step of removing the second etch stop layer pattern and the spacer is performed by a wet etching method using a mixed solution of hydrogen peroxide, water ($H_2O$), and hydrofluoric acid (HF).

24. The method according to claim 1, wherein the step of forming a lower electrode comprises the steps of:
   forming a conductive layer at a thickness at which the storage node hole and the node contact hole are coated and not filled, on the entire surface of a resultant structure on which the node contact hole is formed; and
   forming a plurality of separated storage nodes by removing a top portion of the conductive layer and the second insulating layer pattern.

25. The method according to claim 24, wherein the conductive layer is formed by using a polysilicon layer.

26. The method according to claim 25, wherein the polysilicon layer is formed by diffusion.

27. The method according to claim 24, wherein the step of forming a plurality of separated storage nodes comprises the steps of:
   forming an oxide layer which fills the storage node hole and the node contact hole, on the conductive layer;
   removing a part of the oxide layer and the top of the conductive layer so that the second insulating layer pattern is exposed; and
   removing the oxide layer which fills the storage node hole and the node contact hole, and the second insulating layer pattern, by wet-etching.

28. The method according to claim 27, wherein the oxide layer is formed of a USG layer, a BPSG layer, a double layer of a silicon oxide layer and a USG layer, or a double layer of a silicon oxide layer and a BPSG layer.

29. The method according to claim 24, wherein the step of forming a lower electrode further comprises the step of forming hemispherical grains (HSGs) on the surface of the storage node.

30. The method according to claim 1, wherein the dielectric layer is formed of a $Al_2O_3$ layer, a $Ta_2O_5$ layer, a $SrTiO_3$(STO) layer, a (Ba, Sr) $TiO_3$(BST) layer, a $PbTiO_3$ layer, Pb(Zr, Ti)$O_3$(PZT) layer, a $SrBi_2Ta_2O_9$(SBT) layer, (Pb,La)(Zr,Ti)$O_3$ layer, or a $BaTiO_3$(BTO) layer.

31. The method according to claim 1, wherein the dielectric layer is formed of a triple layer of a silicon oxide layer, a silicon nitride layer, and a silicon oxide layer, or a double layer of a silicon nitride layer and a silicon oxide layer.

32. The method according to claim 1, wherein the upper electrode is formed by using a polysilicon layer.

33. The method according to claim 32, wherein the polysilicon layer is formed by diffusion.

* * * * *

UNITED STATES PATENT AND TRADEMARK OFFICE
CERTIFICATE OF CORRECTION

PATENT NO. : 6,548,349 B2
DATED : April 15, 2003
INVENTOR(S) : Hong-ki Kim

It is certified that error appears in the above-identified patent and that said Letters Patent is hereby corrected as shown below:

<u>Column 10,</u>
Line 27, delete "suicide" and insert -- silicide --.

Signed and Sealed this

First Day of July, 2003

JAMES E. ROGAN
*Director of the United States Patent and Trademark Office*